(12) United States Patent
Kim et al.

(10) Patent No.: US 8,003,514 B2
(45) Date of Patent: Aug. 23, 2011

(54) METHODS OF FABRICATING SEMICONDUCTOR DEVICES INCLUDING STORAGE NODE LANDING PADS SEPARATED FROM BIT LINE CONTACT PLUGS

(75) Inventors: Yong-il Kim, Gyeonggi-do (KR); Makoto Yoshida, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 131 days.

(21) Appl. No.: 12/422,151

(22) Filed: Apr. 10, 2009

(65) Prior Publication Data
US 2009/0258488 A1 Oct. 15, 2009

(30) Foreign Application Priority Data
Apr. 11, 2008 (KR) .................. 10-2008-0033874

(51) Int. Cl.
*H01L 21/4763* (2006.01)
(52) U.S. Cl. ........ 438/622; 438/399; 438/597; 438/637; 438/669; 438/672; 257/E21.495
(58) Field of Classification Search .................. 438/622, 438/640, 666, 668; 257/E21.495
See application file for complete search history.

(56) References Cited

U.S. PATENT DOCUMENTS

| | | | | |
|---|---|---|---|---|
| 5,688,713 | A * | 11/1997 | Linliu et al. | 438/253 |
| 6,258,649 | B1 * | 7/2001 | Nakamura et al. | 438/238 |
| 2001/0005624 | A1 * | 6/2001 | Aoyagi et al. | 438/622 |
| 2001/0041404 | A1 * | 11/2001 | Uchiyama | 438/253 |
| 2005/0001253 | A1 * | 1/2005 | Sugimura | 257/296 |

FOREIGN PATENT DOCUMENTS

| KR | 100155831 B1 | 7/1998 |
|---|---|---|
| KR | 1020060113264 A | 11/2006 |
| KR | 1020070112551 A | 11/2007 |

* cited by examiner

*Primary Examiner* — Angel Roman
(74) *Attorney, Agent, or Firm* — Myers Bigel Sibley & Sajovec, P.A.

(57) ABSTRACT

A method can include forming gate lines on a semiconductor substrate and forming a first interlayer dielectric layer for insulating the gate lines from each other. First and second contact plugs are formed on the semiconductor substrate and landing pads are formed on the first contact plugs and the first interlayer dielectric layer to overlap portions of the first contact plugs. Recessed contact plugs are formed to have recessed portions by etching the second contact plugs, to be located below an upper surface of the first interlayer dielectric layer, where a cross-sectional total distance between the landing pads and the recessed contact plugs increases due to the recessed portions.

16 Claims, 12 Drawing Sheets

METHODS OF FABRICATING SEMICONDUCTOR DEVICES INCLUDING STORAGE NODE LANDING PADS SEPARATED FROM BIT LINE CONTACT PLUGS

CROSS-REFERENCE TO RELATED PATENT APPLICATIONS

This application claims the benefit of Korean Patent Application No. 10-2008-0033874, filed on Apr. 11, 2008, in the Korean Intellectual Property Office, the disclosure of which is incorporated herein in its entirety by reference.

FIELD OF THE INVENTION

The present invention relates to methods of fabricating a semiconductor device, and more particularly, to methods of fabricating a semiconductor device including contact plugs.

BACKGROUND

In general, semiconductor devices can include wires for electrically connecting separate devices, such as transistors or capacitors, to each other. The wires can contact the separate devices via contact plugs that penetrate an interlayer dielectric layer.

SUMMARY

In some embodiments according to the present invention, a method includes forming gate lines on a semiconductor substrate and forming a first interlayer dielectric layer for insulating the gate lines from each other. First and second contact plugs are formed on the semiconductor substrate and landing pads are formed on the first contact plugs and the first interlayer dielectric layer to overlap portions of the first contact plugs. Recessed contact plugs are formed to have recessed portions by etching the second contact plugs, to be located below an upper surface of the first interlayer dielectric layer, where a cross-sectional total distance between the landing pads and the recessed contact plugs increases due to the recessed portions.

DESCRIPTION OF EMBODIMENTS ACCORDING TO THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

It will be understood that when an element, such as a layer, is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/ or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

In some embodiments according to the present invention, a large capacity dynamic random access memory (DRAM) is described as an example of the semiconductor device; however, embodiments according to the present invention are not limited thereto. Each of a plurality of memory cells in the DRAM device includes an access transistor and a capacitor. The access transistor includes a gate line and source/drain electrodes formed on a semiconductor substrate, and the capacitor includes a storage node (storage electrode), a dielectric layer, and a plate electrode. The source/drain electrodes are respectively connected to the storage node or bit lines via first and second contact plugs that penetrate an interlayer dielectric layer on the semiconductor substrate.

In some embodiments according to the present invention, a landing pad is located on a first contact plug connected to a storage node in order to increase a contact area between the first contact plug and a storage node contact plug. However, as appreciated by the present inventors, as the semiconductor device becomes more highly integrated, a distance between the first contact plug connected to the storage node and a second contact plug connected to a bit line can decrease, and thus, electrical shorts may be generated between the landing pad, on the first contact plug connected to the storage node, and the second contact plug connected to the bit line. In some embodiments according to the present invention, the second contact plug connected to the bit line, on which a landing pad is not formed, is recessed to form a recessed contact plug, which may reduce the risk of electrical shorts therebetween.

In other words, in some embodiments according to the present invention, an upper surface of the second contact plug (connected to the bit line) is recessed below a lower surface of the landing pad connected to the storage node. The lower surface of the landing pad can face the upper surface of the second contact plug. Furthermore, an upper surface of the first contact plug (on which the lower surface of the landing pad is formed) is above the upper surface of the second contact plug, so that the upper surface of the second contact plug is recessed below both the lower surface of the landing pad and the upper surface of the first contact plug. Therefore, in some embodiments according to the present invention, a total distance between the first contact plug/landing pad and the second contact can be increased even as the spacing between devices is reduced. In some embodiments according to the present invention, the total distance includes a lateral and a vertical spacing. In other words, in some embodiments according to the present invention, the upper surface of the second contact can have increased spacing both the lateral and vertical directions.

In some embodiments according to the present invention, a contact plug is recessed to reduce electrical shorts between a landing pad that is formed on an immediately adjacent one of the contact plugs. In particular, a recessed contact plug can be formed simultaneously with the landing pad using the same process, and thus, electrical shorts between the landing pad and the contact plug can be reduced without performing an additional process for forming the recessed contact plug.

Figure 1:
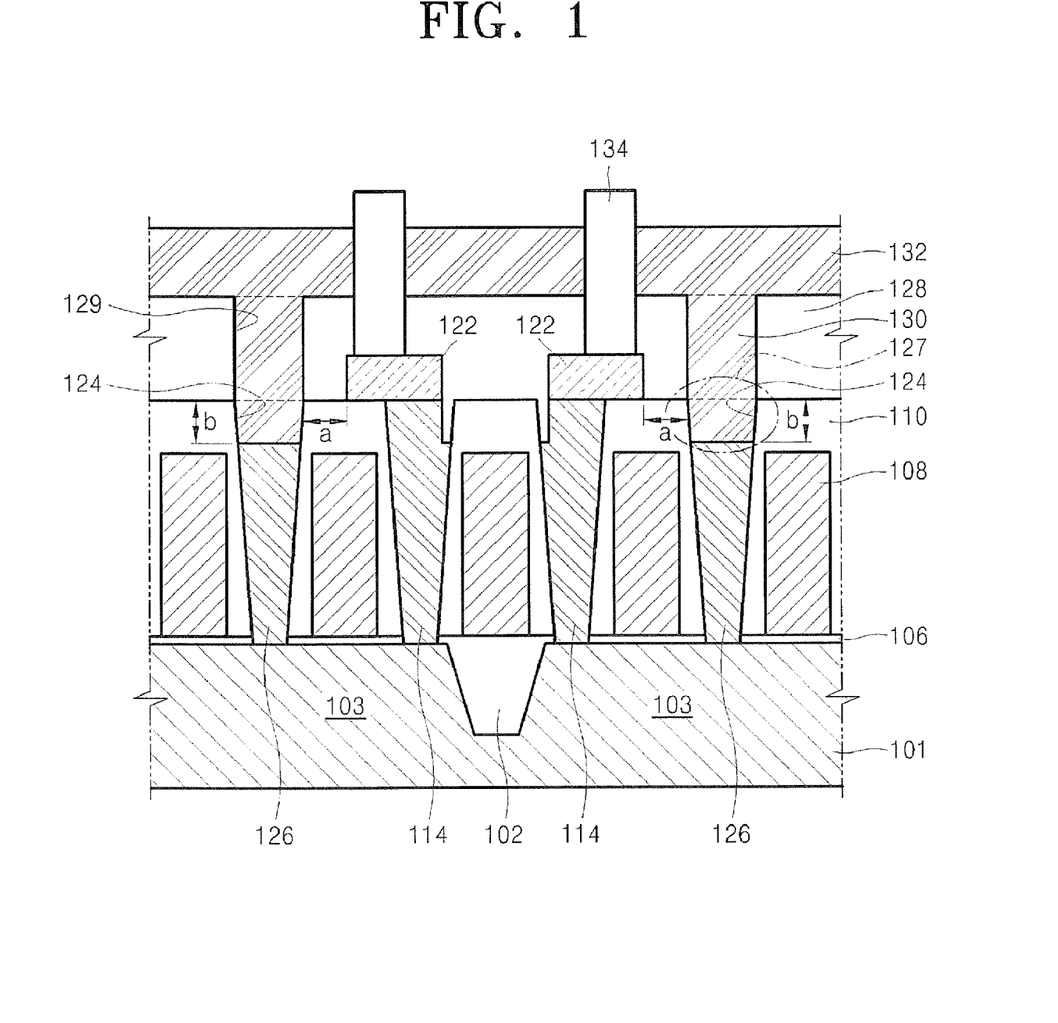
FIG. 1 is a schematic cross-sectional view of a semiconductor device in some embodiments according to the present invention.

FIG. 1 is a schematic cross-sectional view of a semiconductor device in some embodiments according to the present invention. Referring to FIG. 1, the semiconductor device of the present embodiment includes a device isolation layer 102 and active regions 103 formed in a semiconductor substrate 101, for example, a silicon substrate. A gate insulating layer 106 and gate lines 108 (word lines) are formed on the active regions 103. Each of the gate lines 108 includes a gate electrode (not shown) formed on the gate insulating layer 106 and a capping layer (not shown) covering the gate electrode.

A first interlayer dielectric layer 110 for insulating the gate lines 108 from each other is formed on the entire surface of the semiconductor substrate 101, on which the gate lines 108 are formed. First contact plugs 114 and recessed contact plugs 126 that contact the active region 103 between the gate lines 108 by penetrating the first interlayer dielectric layer 110 are formed. Each of the recessed contact plugs 126 has a recessed portion 124, wherein the recessed contact plugs 126 are disposed lower than an upper surface of the first interlayer dielectric layer 110. The first contact plugs 114 are contact plugs that are electrically connected to storage node contact plugs. The recessed contact plugs 126 are contact plugs that are electrically connected to bit line contact plugs.

Landing pads 122 are formed as islands on the first contact plugs 114 and the first interlayer dielectric layer 110 so as to overlap a part of the first contact plugs 114. The landing pads 122 are connected to respective storage node contact plugs 134. The landing pads 122 are formed to increase a contact area between the first contact plugs 114 and the storage node contact plugs 134. That is, the landing pads 122 are formed so as to increase the contact area between the first contact plugs 114 and the storage node contact plugs 134 when the first contact plugs 114 and the storage node contact plugs 134 deviate from each other vertically.

In particular, in some embodiments according to the present invention, a cross-sectional distance between the landing pads 122 and the recessed contact plugs 126 increases due to the recessed portions 124 as shown in reference numeral 127. The distance can include both a lateral spacing shown by "a" and a vertical spacing shown by "b" in FIG. 1. That is, if the plug 126 were not recessed, the distance between the landing pads 122 and the plug 126 is "a"; however, in some embodiments according to the present invention, the total distance between the landing pads 122 and the recessed contact plugs 126 includes "a"+"b" due to the recessed portions 124. Therefore, electrical shorts between the landing pads 122 and the recessed contact plugs 126 can be reduced despite when the semiconductor device is highly integrated.

A second interlayer dielectric layer 128 is formed on the entire surface of the semiconductor device, on which the first contact plugs 114 and the recessed contact plugs 126 are formed. Then, the second interlayer dielectric layer 128 is etched to form contact holes 129 exposing the upper surfaces of the recessed contact plugs 126. Accordingly, third contact plugs 130 that are connected to the recessed contact plugs 126 by penetrating the contact holes 129 are formed. The third contact plugs 130 are bit line contact plugs that are connected to a bit line 132.

Hereinafter, methods of fabricating the semiconductor device of FIG. 1 in some embodiments according to the invention will be described in detail. FIGS. 2 through 12 are schematic cross-sectional and plan views illustrating methods of fabricating a semiconductor device, in some embodiments according to the present invention. Here, the semiconductor device is a DRAM device, as an example. FIGS. 2 through 12 illustrate an exemplary method of fabricating the semiconductor device, and the present invention is not limited thereto.

Figure 2:
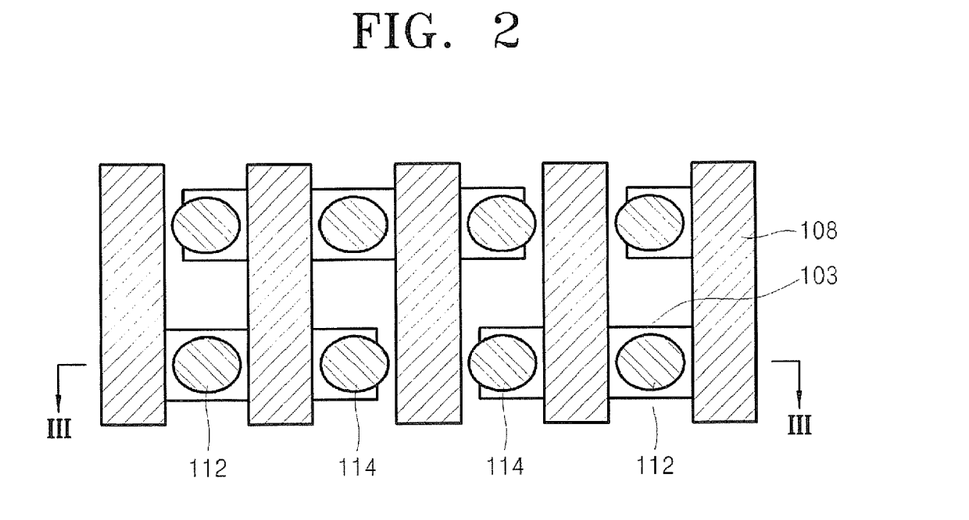
FIGS. 2 through 12 are schematic cross-sectional and plan views illustrating methods of fabricating a semiconductor device in some embodiments according to the present invention.
Figure 3:
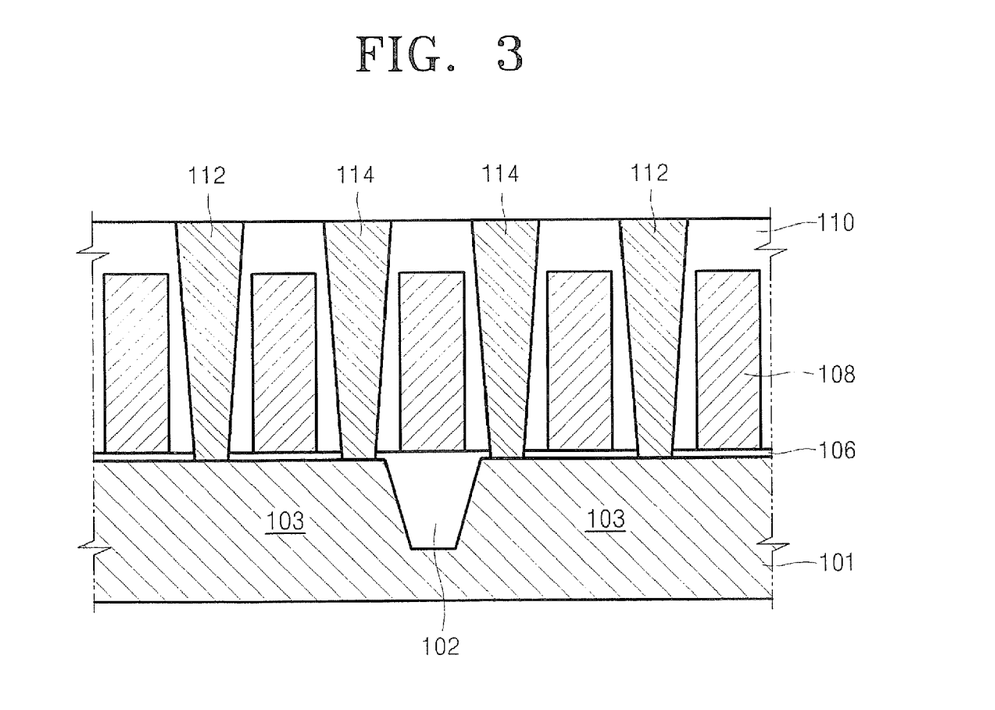

Referring to FIGS. 2 and 3, FIG. 2 is a plan view of the semiconductor device, and FIG. 3 is a cross-sectional view of the semiconductor device taken along a line III-III of FIG. 2. Referring to FIG. 3, device isolation layers 102 are formed in a semiconductor substrate 101, for example, a silicon substrate, to define a plurality of active regions 103. Referring to FIG. 2, the active regions 103 are formed on a plane, and the device isolation layers 102 are formed between the active regions 103. The device isolation layers 102 may be formed using a shallow trench isolation method.

A gate insulating layer 106 is formed on the active regions 103 of the semiconductor substrate 101. In addition, a plurality of gate lines 108 (word lines) are formed to cross the active regions 103 of the semiconductor substrate 101. Each of the gate lines 108 includes a gate electrode (not shown) formed on a gate insulating layer, and a capping layer (not shown) covering the gate electrode. The gate lines 108 may be formed by depositing a polysilicon layer pattern and a metal silicide layer pattern, and may include spacers on both sidewalls of the gate electrodes.

Referring to FIG. 3, a first interlayer dielectric layer 110 insulating the gate lines 108 is formed on the entire surface of the semiconductor substrate 101, on which the gate lines 108 are formed. The first interlayer dielectric layer 110 may include silicon oxide. In addition, first contact plugs 114 and second contact plugs 112, which are respectively connected to the active regions 103 between the gate lines 108 by penetrating the first interlayer dielectric layer 110, are formed. The first and second contact plugs 114 and 112 may be polysilicon layers doped with impurities. The first contact plugs 114 are electrically connected to storage node contact plugs subsequently. The second contact plugs 112 are electrically connected to bit lines contact plugs subsequently.

Figure 4:
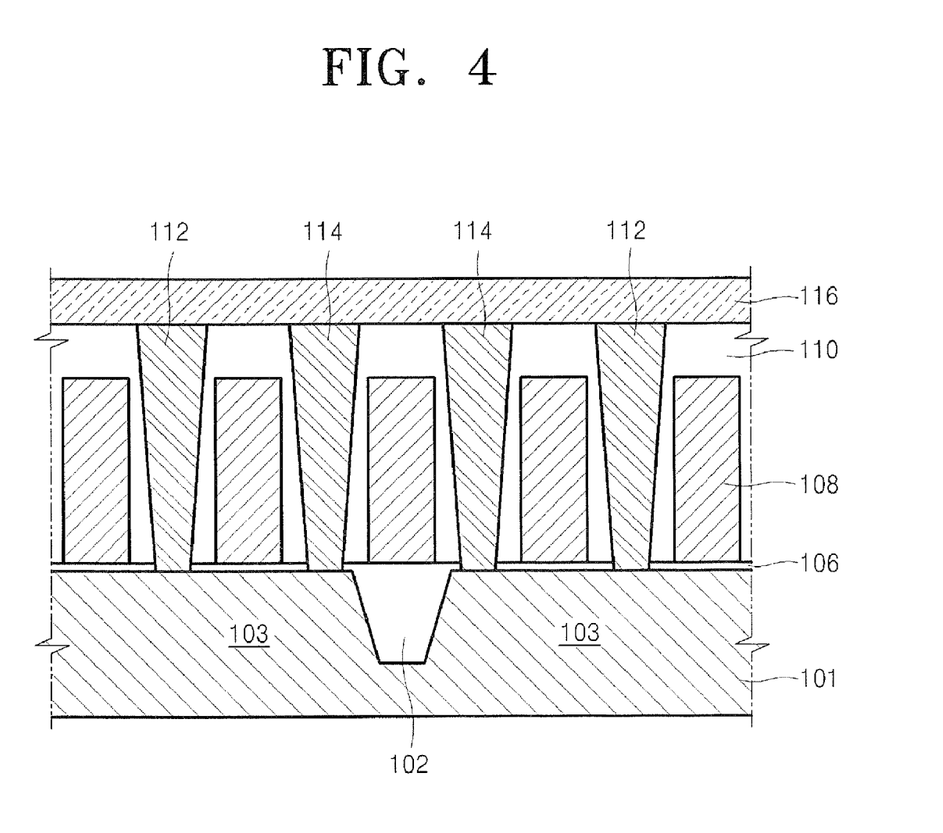
Figure 5:
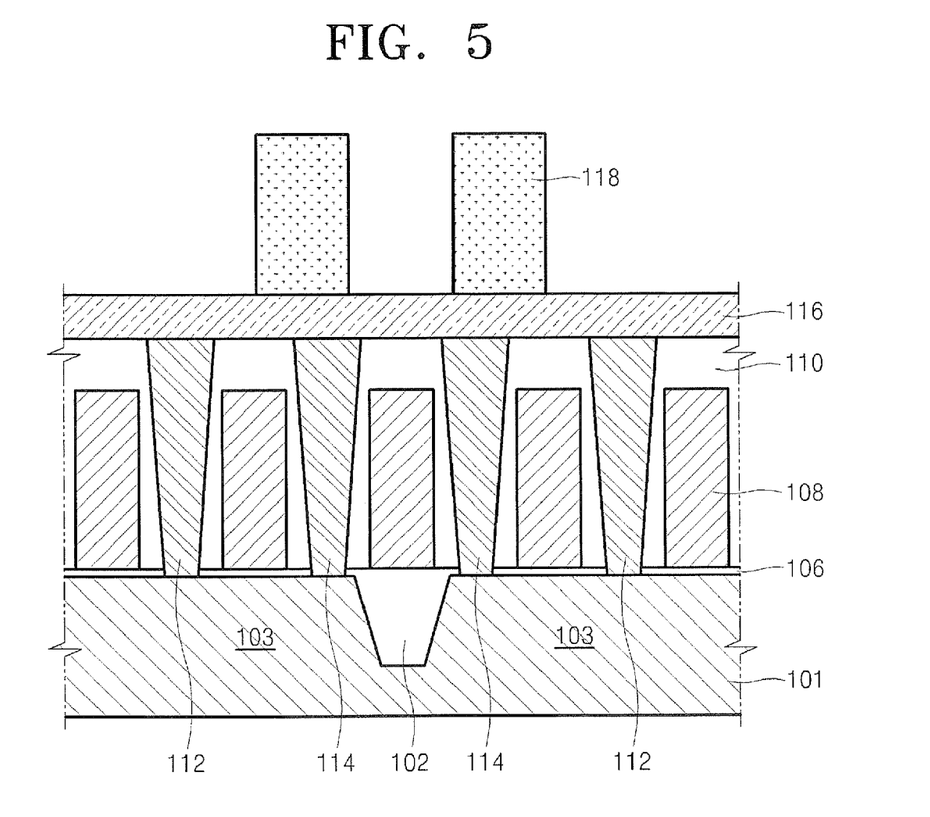

Referring to FIGS. 4 and 5, a conductive layer 116 for forming landing pads is formed on the first contact plugs 114, the second contact plugs, 112, and the first interlayer dielectric layer 110. The conductive layer 116 for the landing pads may comprise a polysilicon layer doped with impurities or a metal layer such as a tungsten layer. When the conductive layer 116 for the landing pads comprises a metal layer such as a tungsten layer, contact resistance between the conductive layer 116 and fourth contact plugs (134 of FIG. 12) may decrease, and the polysilicon layer forming the second contact plugs 112 can be subsequently etched. Referring to FIG. 5, a mask layer 118 for forming the landing pads is formed on the conductive layer 116. The mask layer 118 for forming the landing pads is formed to expose upper portions of the second contact plugs 112. The mask layer 118 for the landing pads may be formed using a photolithographic process.

Figure 6:
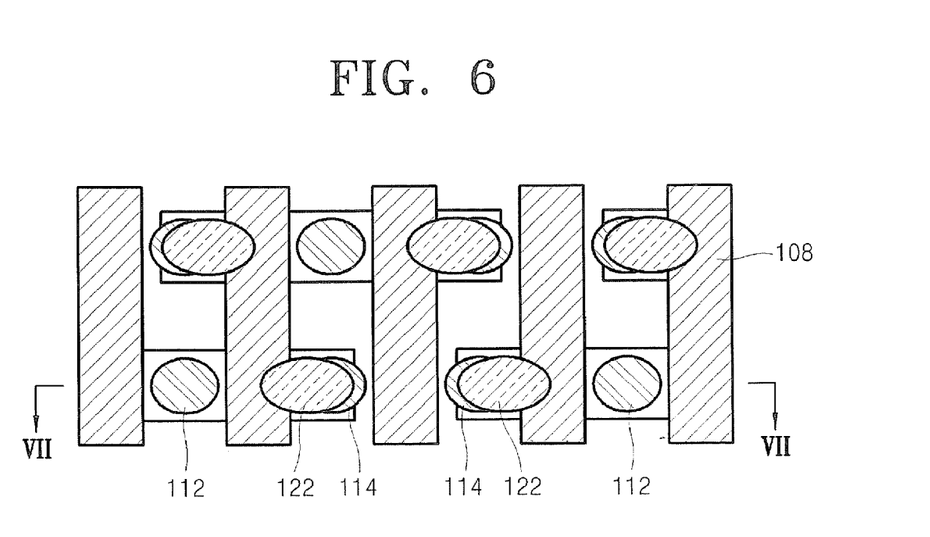
Figure 7:
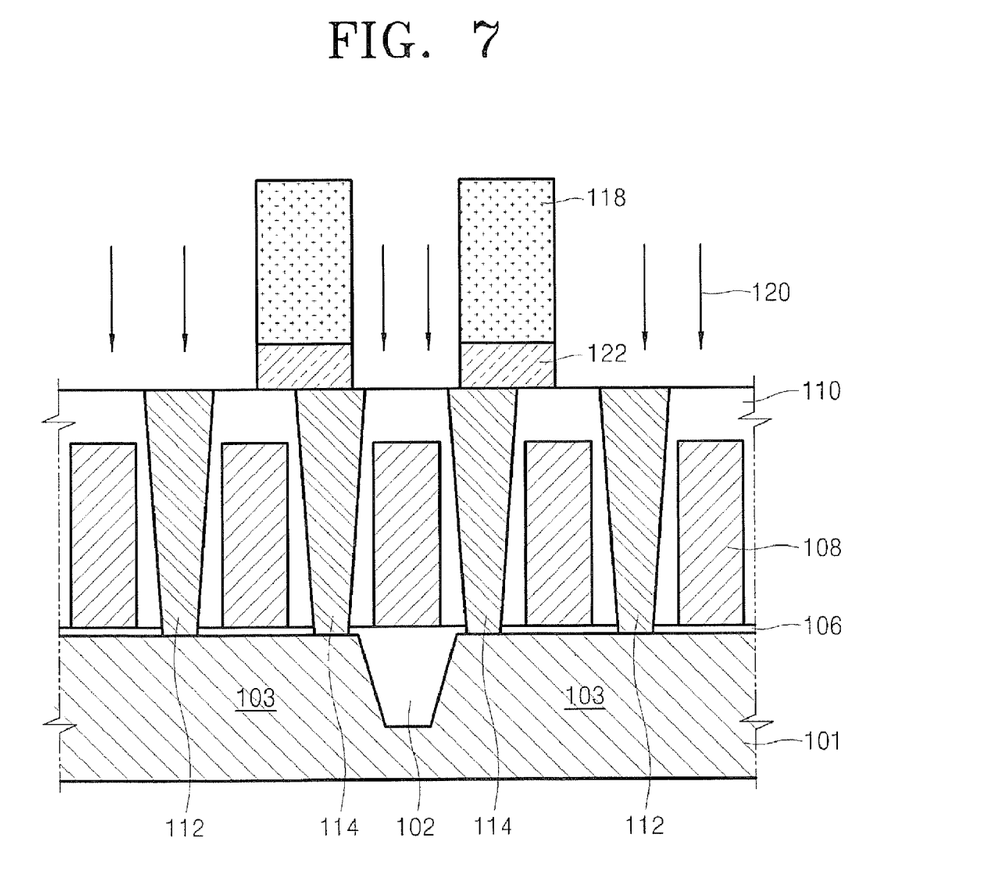

FIG. 6 is a plan view of the semiconductor device, and FIG. 7 is a cross-sectional view of the semiconductor device taken along a line VII-VII of FIG. 6. As denoted by reference numeral 120, the conductive layer 116 for forming the landing pads is etched using the mask layer 118 as an etching mask. The conductive layer 116 may be etched using a dry etching method. Then, landing pads 122 are formed as islands overlapping portions of the first contact plugs 114, and upper surfaces of the second contact plugs 112 are exposed.

Figure 8:
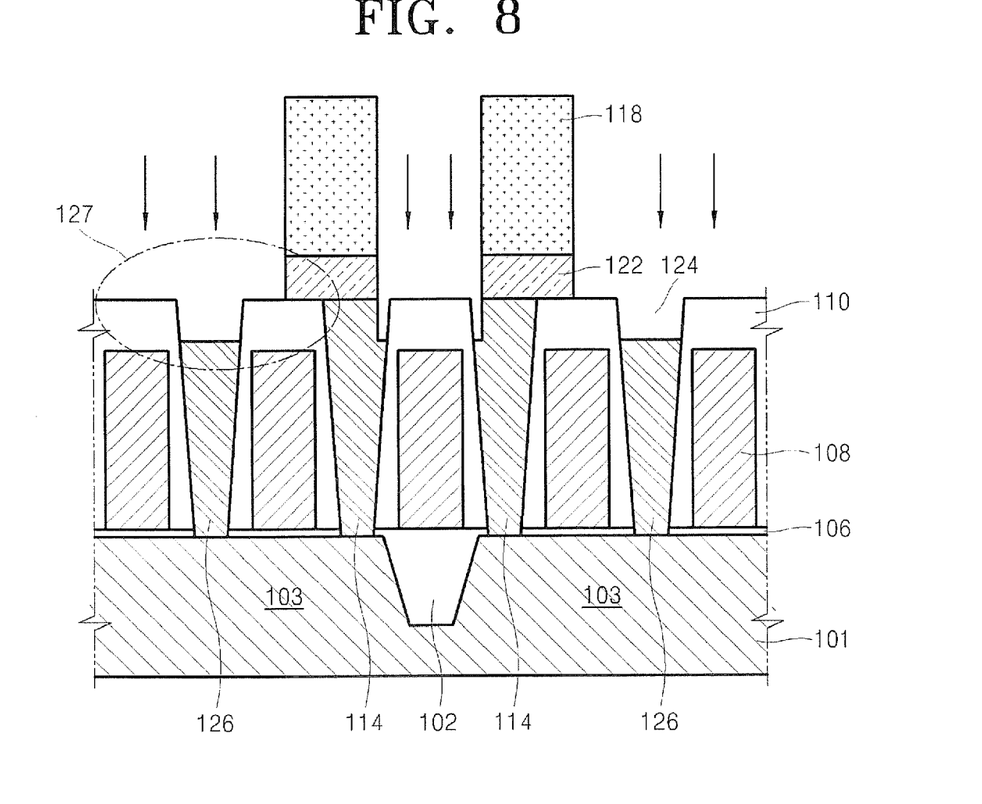

Referring to FIG. 8, the second contact plugs 112 are etched using the mask layer 118 as an etching mask to form the recessed contact plugs 126 having recessed portions 124 (also referred to herein as "recesses 124"), so that the upper surfaces of the recessed contact plugs 126 are located below the upper surface of the first interlayer dielectric layer 110. After forming the recessed contact plugs 126, the mask layer 118 for forming the landing pads 122 is removed.

In some embodiments according to the present invention, according to FIG. 5-8 for example, the conductive layer 116 and the underlying second contact plugs 112 are etched simultaneously to form the recessed contact plugs 126. Accordingly, the recessed contact plugs 126 can be formed without performing an additional fabrication step.

In particular, the total distance between the landing pads 122 and the recessed contact plugs 126 can be increased due to the recesses 124 above the upper surfaces of the recessed contact plugs 126 as denoted by the portion of FIG. 8 associated with reference numeral 127. Accordingly, electrical shorts between the landing pads 122 and the recessed contact plugs 126 can be reduced.

Figure 9:
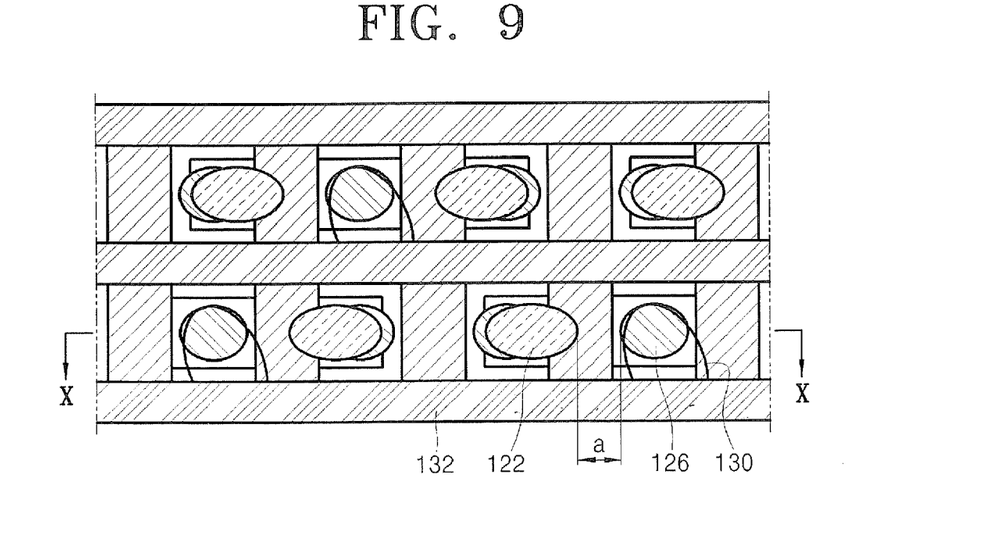
Figure 10:
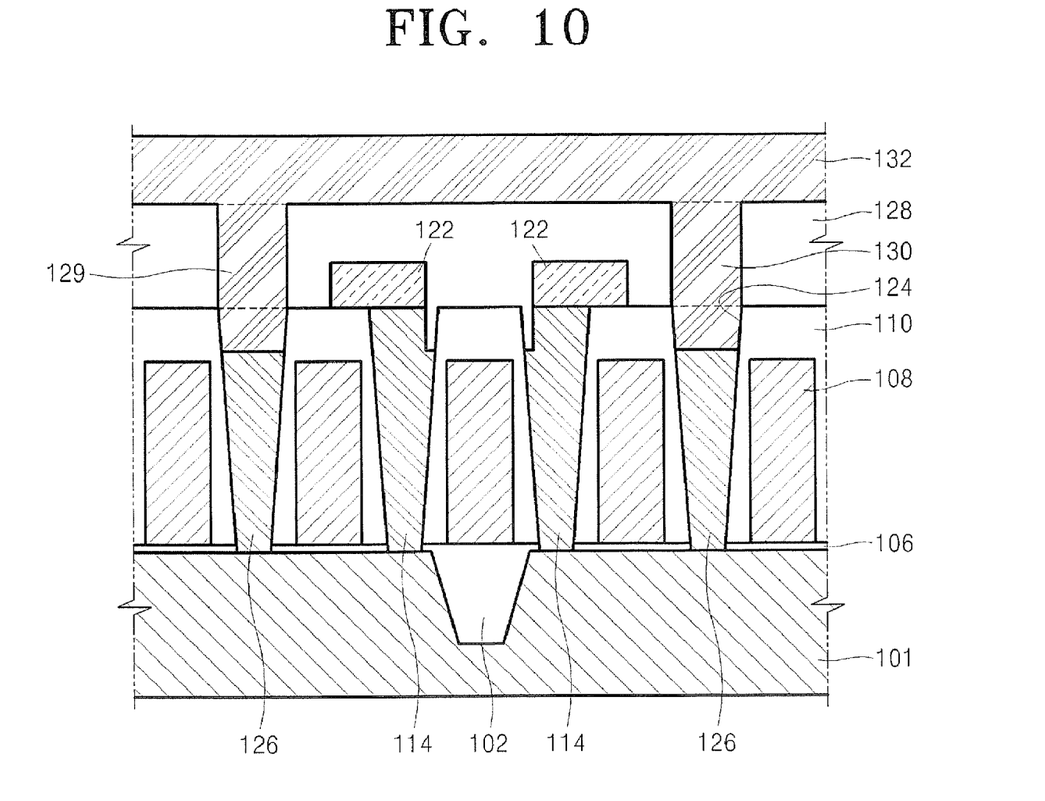

FIG. 9 is a plan view of the semiconductor device, and FIG. 10 is a cross-sectional view of the semiconductor device taken along a line X-X of FIG. 9 in some embodiments according to the present invention. Referring to FIG. 9, a planar (sometimes referred to herein as "lateral") distance between the landing pads 122 and the recessed contact plugs 126 is represented as "a." Accordingly, the recesses 124 are formed to increase the total cross-sectional distance between the landing pads 122 and the recessed contact plugs 126.

Referring to FIGS. 9 and 10, a second interlayer dielectric layer 128 is formed on the entire surface of the semiconductor substrate 101, on which the first contact plugs 114, the landing pads 122, and the recessed contact plugs 126 are formed. The second interlayer dielectric layer 128 may be formed of a silicon oxide. The landing pads 122 and the recessed contact plugs 126 are insulated from each other by the second interlayer dielectric layer 128. Contact holes 129 exposing the upper surfaces of the recessed contact plugs 126 are formed by penetrating the second interlayer dielectric layer 128.

In addition, third contact plugs 130 that are connected to the recessed contact plugs 126 are formed. The third contact plugs 130 are bit line contact plugs that are subsequently connected to bit lines. Next, bit lines 132 contacting the third contact plugs 130 are formed. The bit lines 132 are formed in a direction perpendicular to the direction in which the gate lines 108 are formed.

Figure 11:
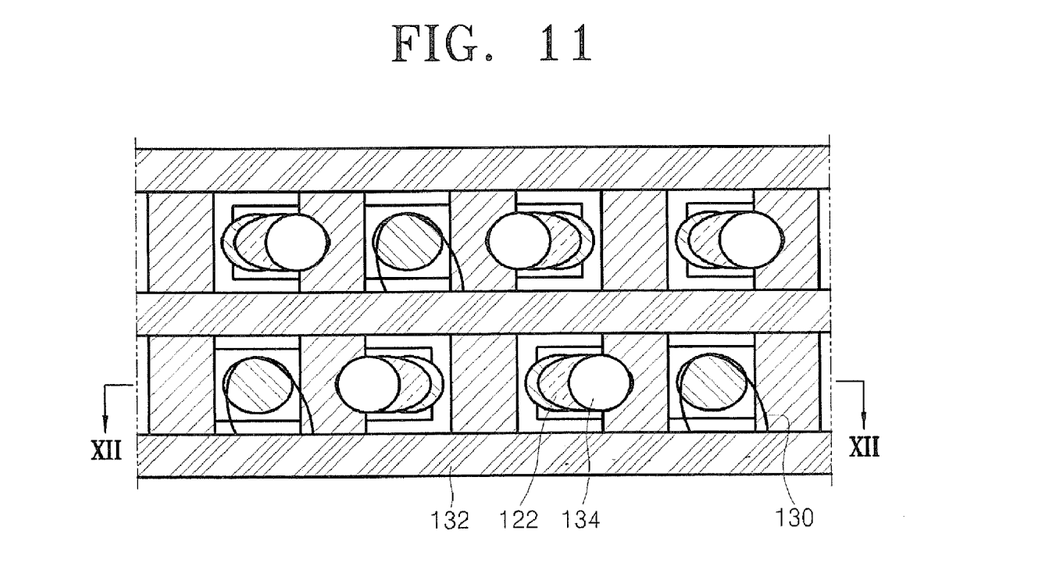
Figure 12:
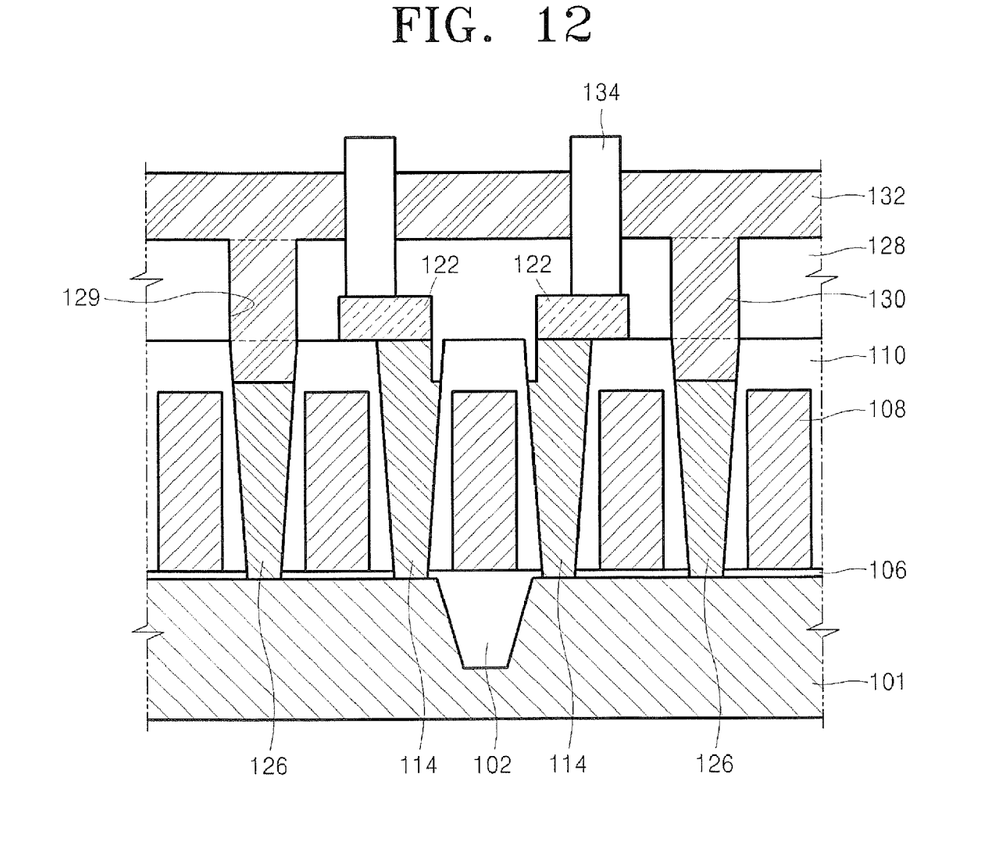

FIG. 11 is a plan view of the semiconductor device, and FIG. 12 is a cross-sectional view of the semiconductor device taken along a line XII-XII of FIG. 11 in some embodiments according to the present invention. Referring to FIGS. 11 and 12, fourth contact plugs 134 that are connected to the landing pads 122 by penetrating the second interlayer dielectric layer 128 are formed. The fourth contact plugs 134 are storage node contact plugs that are subsequently connected to storage nodes (not shown).

FIGS. 13 through 19 are schematic cross-sectional and plan views illustrating methods of fabricating a semiconductor device, in some embodiments according to the present invention. The semiconductor device of FIGS. 13 through 19 is a DRAM semiconductor device, as an example. FIGS. 13 through 19 illustrate an exemplary method of fabricating the semiconductor device, and the present invention is not limited thereto.

In some embodiments according to the present invention, the fabrication steps of the method of fabricating the semiconductor device are the same as those illustrated by FIGS. 1-3 except for forming the recessed contact plugs 126. Therefore, after performing the fabrication steps illustrated by FIGS. 1-3, the following steps can be performed.

Figure 13:
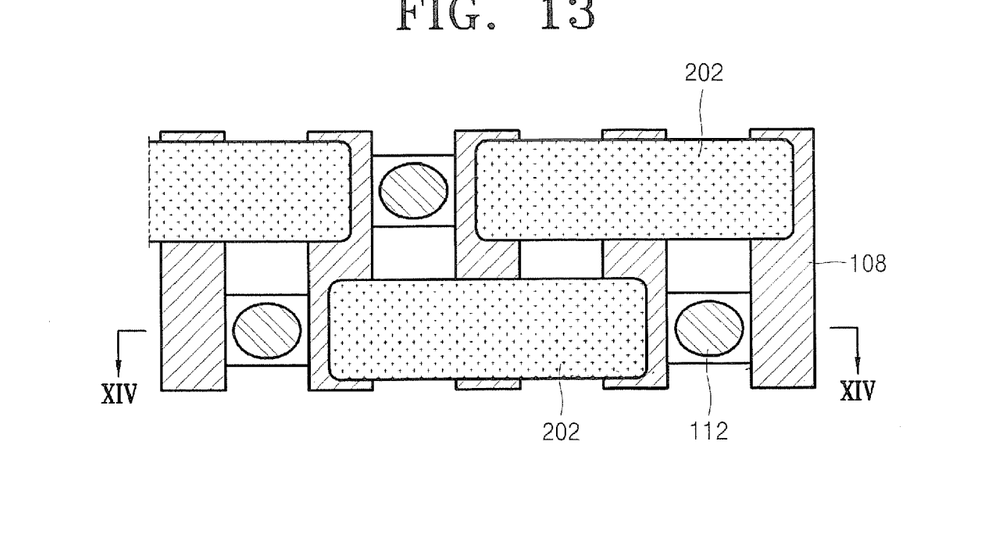
FIGS. 13 through 19 are schematic cross-sectional and plan views illustrating methods of fabricating a semiconductor device in some embodiments according to the present invention.
Figure 14:
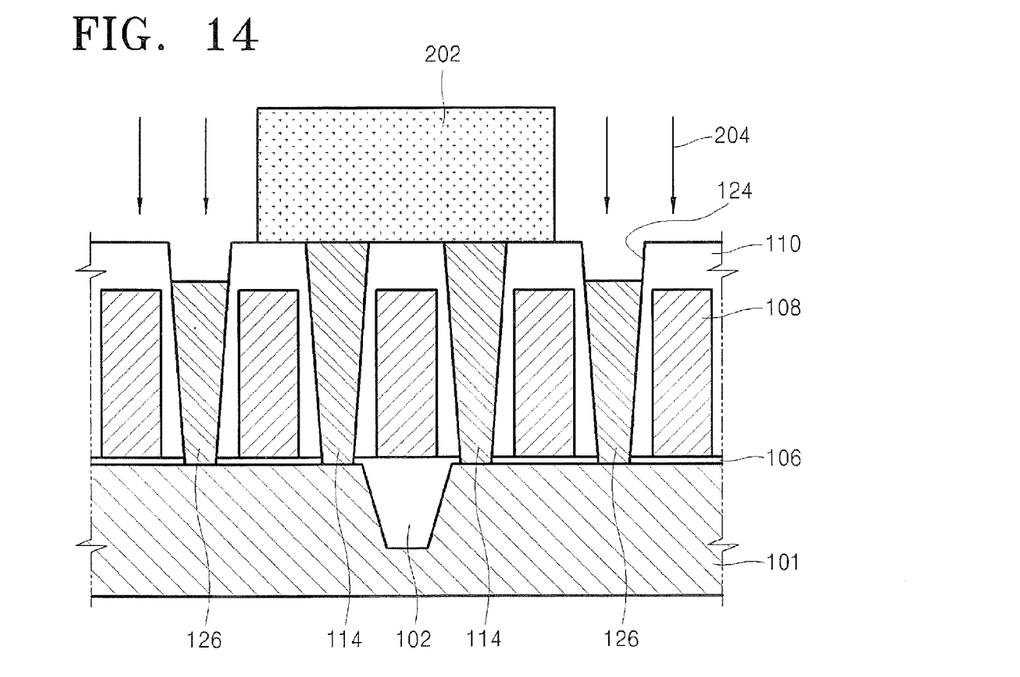

FIG. 13 is a plan view of the semiconductor device of the present embodiment, and FIG. 14 is a cross-sectional view of the semiconductor device taken along a line XIX-XIX of FIG. 13 in some embodiments according to the present invention. Referring to FIGS. 13 and 14, a mask layer 202 for forming recessed contact plugs and exposing the second contact plugs 112 is formed on the first contact plugs 114 and the first interlayer dielectric layer 110. As denoted by reference numeral 204, the second contact plugs 112 are etched using the mask layer 202 as an etching mask to form the recessed contact plugs 126 having the recesses 124 thereon. In addition, the mask layer 202 is removed.

Figure 15:
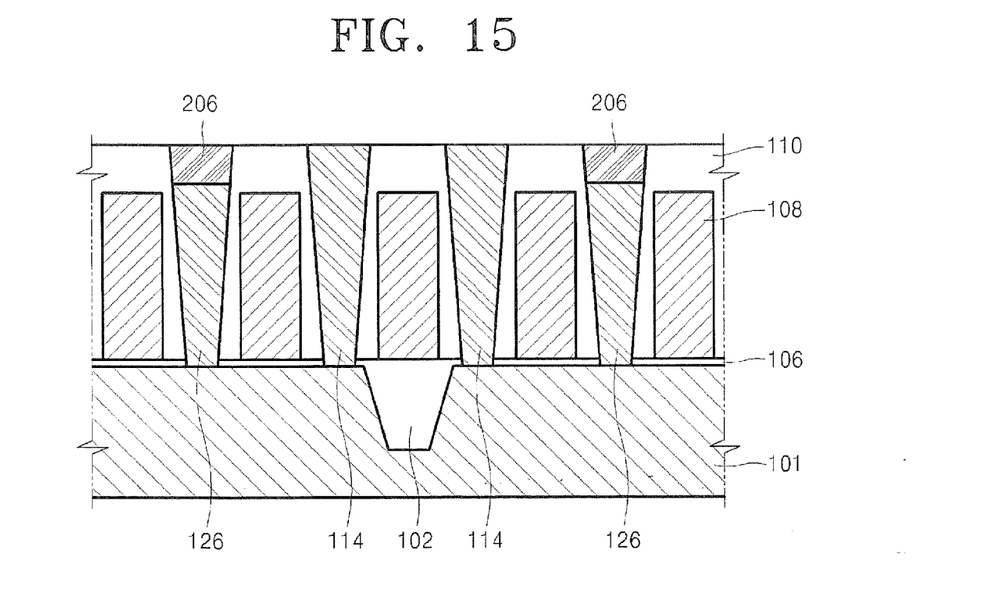
Figure 16:
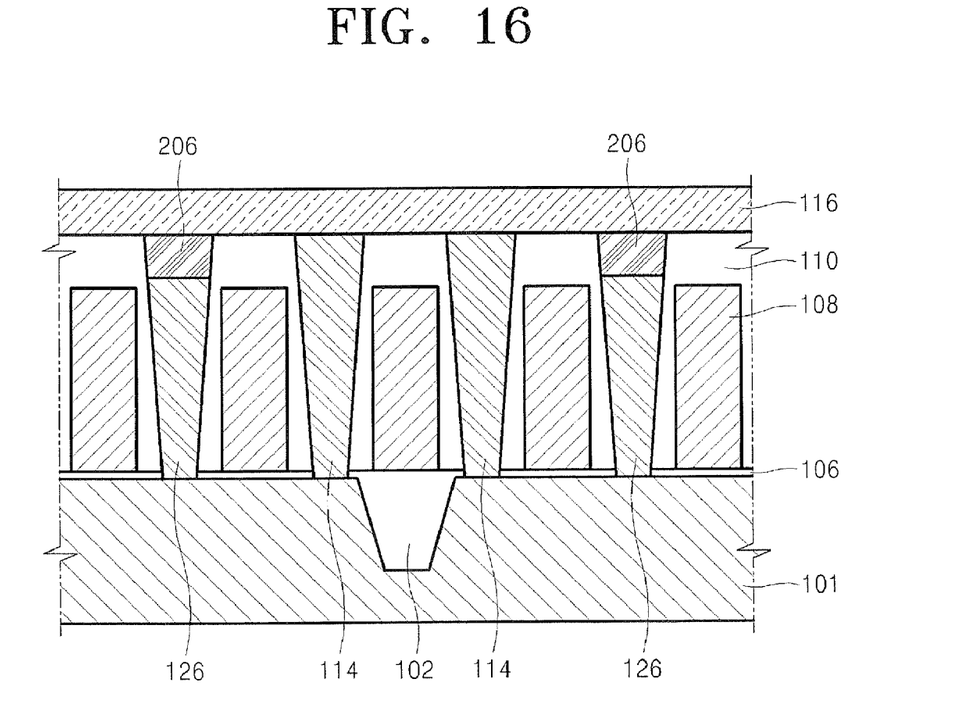

Referring to FIGS. 15 and 16, buried insulating layers 206 that fill in the recesses 124 are formed. The buried insulating layers 206 are formed by forming an insulating layer on the entire surface of the semiconductor substrate 101 so as to fill the recesses 124, and then, planarizing the formed insulating layer. In addition, as illustrated in FIG. 16, the conductive layer 116 for forming the landing pads is formed on the first contact plugs 114, the buried insulating layer 206, and the first interlayer dielectric layer 110.

Figure 17:
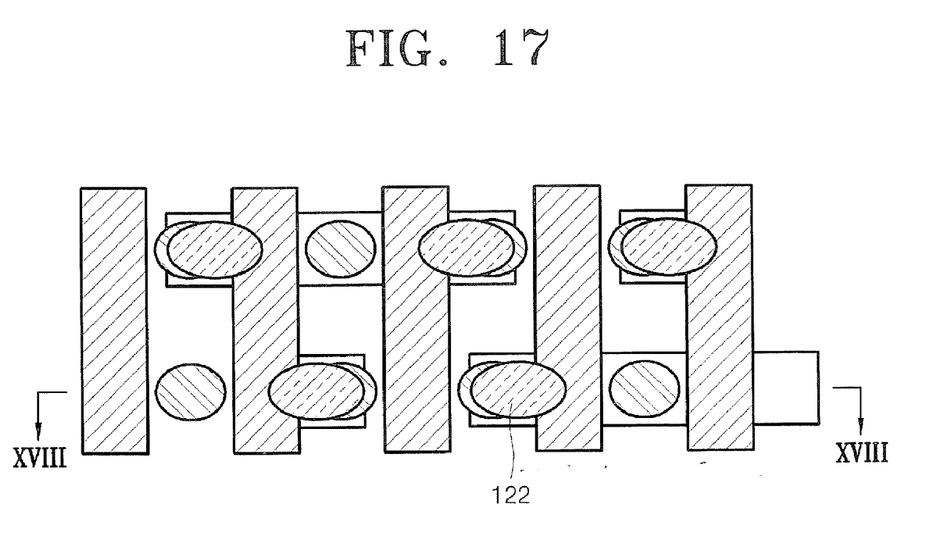
Figure 18:
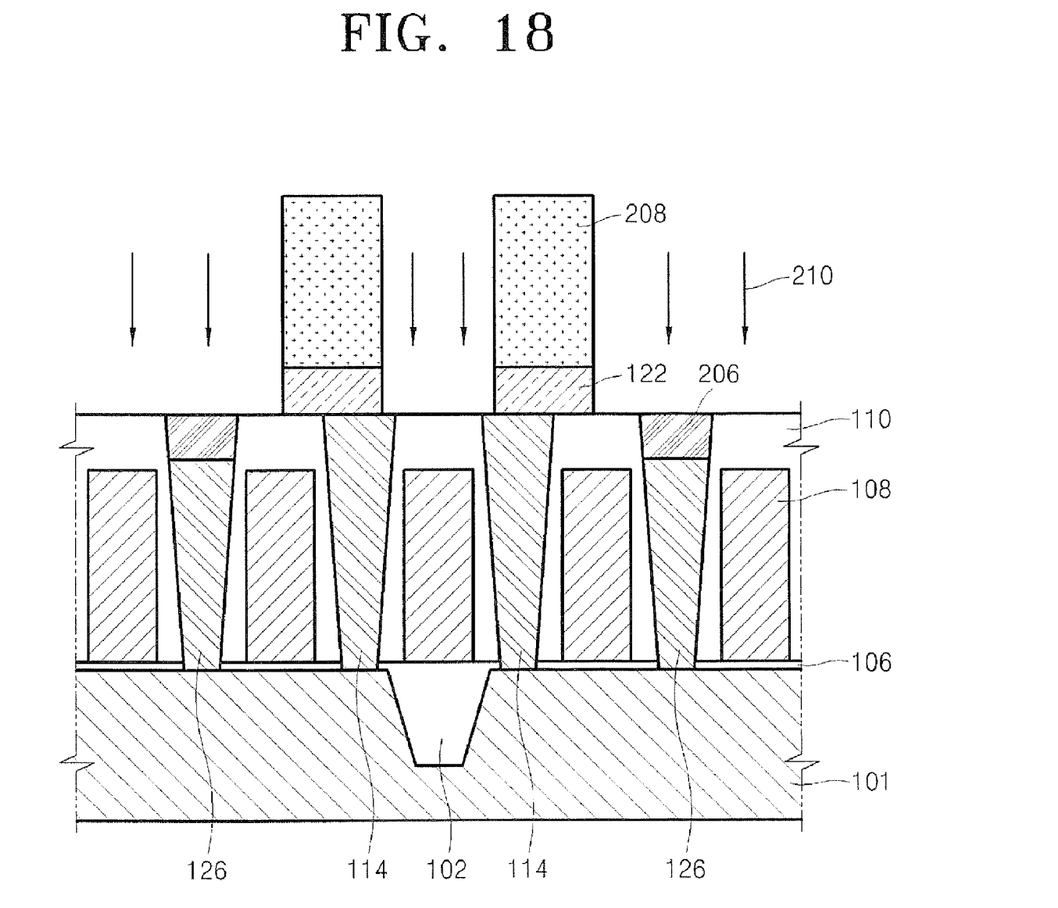

FIG. 17 is a plan view of the semiconductor device, and FIG. 18 is a cross-sectional view of the semiconductor device taken along a line XVII-XVII of FIG. 17 in some embodiments according to the present invention. Referring to FIGS. 17 and 18, a mask layer 208 for forming the landing pads is formed on the conductive layer 116 for the landing pads. The mask layer 208 is absent from portions of the substrate 110 so that the upper portions (or surfaces) of the buried insulation layers 206 are exposed.

In addition, the conductive layer 116 is etched using the mask layer 208 as an etching mask as denoted by arrows 210 so as to form the landing pads 122 that overlap portions of the first contact plugs 114. Then, the mask layer 208 for forming the landing pads is removed. In some embodiments according to the present invention, the buried insulation layers 206 are removed simultaneously with the conductive layer 116 (exposed outside the mask 208) or are removed simultaneously with the mask 208, or are removed separately before or after removal of the mask 208.

Figure 19:
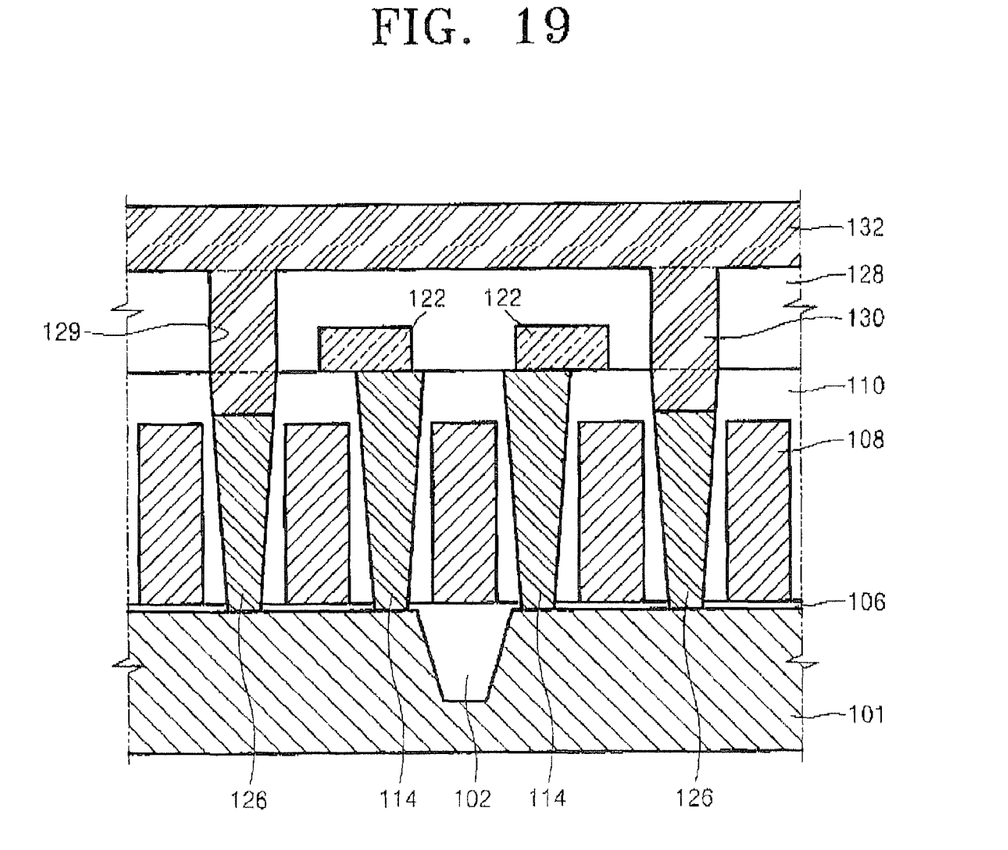

Referring to FIG. 19, the second interlayer dielectric layer 128 is formed on the entire surface of the semiconductor substrate 101, on which the first contact plugs 114, the landing pads 122, and the buried insulating layers 206 are formed. In addition, the contact holes 129 are formed by penetrating the second interlayer dielectric layer 128 to expose the upper surfaces of the recessed contact plugs 126. In some embodiments according to the invention, the buried insulation layers 206 are removed with the second interlayer dielectric layer 128 to expose the upper surfaces of the recessed contact plugs 126. Next, the third contact plugs 130 that contact the recessed contact plugs 126 are formed. The third contact plugs 130 are bit line contact plugs that are subsequently connected to bit lines. In addition, the bit lines 132 contacting the third contact plugs 130 are formed.

After that, the fourth contact plugs 134 that are connected to the landing pads 122 by penetrating the second interlayer dielectric layer 128 are formed as illustrated in FIGS. 11 and 12. The fourth contact plugs 134 are storage node contact plugs that are subsequently connected to storage nodes (not shown).

The semiconductor device according to the present invention includes landing pads formed on first contact plugs in order to increase the contact area between the first contact plugs and storage node contact plugs. In addition, according to the present invention, second contact plugs connected to bit lines, on which landing pads are not formed, are recessed to form recessed contact plugs in order to reduce the likelihood of electrical shorts.

Accordingly, the cross-sectional total, lateral and vertical, distance between the landing pads and the recessed contact plugs can be increased due to the recessed portions, and thus, electrical shorts between the landing pads and the recessed contact plugs can be reduced despite when the semiconductor device is highly integrated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, the method comprising:
    forming gate lines on a semiconductor substrate in a memory cell region of the device;
    forming a first interlayer dielectric layer on the semiconductor substrate;
    forming first contact plugs and second contact plugs immediately adjacent to opposing sides of the gate lines in the memory cell region;
    forming landing pads on the first contact plugs and the first interlayer dielectric layer; and
    etching the second contact plugs to form recessed contact plugs having recessed surfaces below an upper surface of the first interlayer dielectric layer;
    wherein a cross-sectional total distance between the landing pads and the recessed contact plugs increases due to etching the second contact plugs to form recessed contact plugs.

2. The method of claim 1, wherein the recessed contact plugs comprise contact plugs that are electrically connected to bit line contact plugs, and the first contact plugs comprise contact plugs that are electrically connected to storage node contact plugs.

3. The method of claim 1, wherein forming recessed contact plugs comprises:
    forming a mask layer which exposes the second contact plugs, on the first contact plugs and the first interlayer dielectric layer; and
    forming the recessed surfaces by etching the second contact plugs using the mask layer.

4. The method of claim 3, wherein forming landing pads comprises:
    forming a buried insulating layer in the recessed portions;
    forming a conductive layer for forming landing pads on the first contact plugs, the buried insulating layer, and the first interlayer dielectric layer;
    forming a landing pad mask layer for forming the landing pads on the conductive layer; and
    forming the landing pads overlapping portions of the first contact plugs by etching the conductive layer using the landing pad mask layer as an etching mask.

5. A method of fabricating a semiconductor device, the method comprising:
    forming gate lines on a semiconductor substrate;
    forming a first interlayer dielectric layer for insulating the gate lines from each other;
    forming first contact plugs and second contact plugs on the semiconductor substrate;
    forming landing pads, to overlap portions of the first contact plugs on the first interlayer dielectric layer;
    forming recessed contact plugs having recessed portions by etching the second contact plugs, to below an upper surface of the first interlayer dielectric layer, wherein a cross-sectional total distance between the landing pads and the recessed contact plugs increases due to the recessed portions, wherein forming landing pads comprises:
    forming a conductive layer on the first contact plugs, the second contact plugs, and the first interlayer dielectric layer;
    forming a mask layer on the conductive layer; and forming the landing pads to overlap portions of the first contact plugs by etching the conductive layer using the mask layer as an etching mask.

6. The method of claim 5, wherein the second contact plugs and the conductive layer are etched simultaneously to form the recessed contact plugs.

7. A method of fabricating a semiconductor device, the method comprising:
    forming gate lines on a semiconductor substrate;
    forming a first interlayer dielectric layer for insulating the gate lines from each other;
    forming first contact plugs and second contact plugs on the semiconductor substrate;
    forming landing pads, to overlap portions of the first contact plugs on the first interlayer dielectric layer; and
    forming recessed contact plugs having recessed portions by etching the second contact plugs, to below an upper surface of the first interlayer dielectric layer,
    wherein a cross-sectional total distance between the landing pads and the recessed contact plugs increases due to the recessed portions, further comprising:
    forming a second interlayer dielectric layer on an entire surface of the semiconductor substrate, on which the first contact plugs and the recessed contact plugs are formed;
    forming third contact plugs that are connected to the recessed contact plugs by penetrating the second interlayer dielectric layer; and
    forming bit lines connected to the third contact plugs.

8. The method of claim 7, further comprising:
    forming fourth contact plugs connected to the landing pads by penetrating the second interlayer dielectric layer after forming the bit lines.

9. The method of claim 8, wherein the third contact plugs comprise bit line contact plugs connected to the bit lines, and the fourth contact plugs comprise storage node contact plugs connected to storage nodes.

10. A method of fabricating a semiconductor device, the method comprising:
    forming a device isolation layer on a semiconductor substrate to define active regions therein;
    forming a plurality of gate lines crossing the active regions in a memory cell region of the device;
    forming a first interlayer dielectric layer on the semiconductor substrate;
    forming first contact plugs and second contact plugs that are connected to the active region by penetrating the first interlayer dielectric layer immediately adjacent to opposing sides of ones of the plurality of gate lines; and
    forming landing pads, to overlap portions of the first contact plugs on the first interlayer dielectric layer, and forming recessed contact plugs having recessed surfaces by etching the second contact plugs, to below a surface of the first interlayer dielectric layer.

11. The method of claim 10, wherein the gate lines are formed to perpendicularly cross the active regions.

12. A method of fabricating a semiconductor device, the method comprising:
    forming a device isolation layer on a semiconductor substrate to define active regions therein;
    forming a plurality of gate lines crossing the active regions;
    forming a first interlayer dielectric layer on a surface of the semiconductor substrate to insulate the plurality of gate lines from each other;
    forming first contact plugs and second contact plugs connected to the active regions by penetrating the first interlayer dielectric layer;
    forming landing ads to overlap portions of the first contact plugs on the first interlayer dielectric layer;
    forming recessed contact plugs having recessed portions by etching the second contact plugs, to below a surface of the first interlayer dielectric layer, further comprising:
    forming a second interlayer dielectric layer on the surface of the semiconductor substrate, on which the first contact plugs and the recessed contact plugs are formed;
    forming third contact plugs connected to the recessed contact plugs by penetrating the second interlayer dielectric layer;
    forming bit lines connecting to the third contact plugs; and
    forming fourth contact plugs connected to the landing pads by penetrating the second interlayer dielectric layer.

13. The method of claim 12, wherein the third contact plugs comprise bit line plugs connected to the bit lines, and the fourth contact plugs comprise storage node contact plugs connected to storage nodes.

14. The method of claim 13, wherein the recessed contact plugs are electrically connected to the bit line contact plugs, and the first contact plugs are electrically connected to the storage node contact plugs.

15. A method of fabricating a semiconductor device, the method comprising:
    forming a device isolation layer on a semiconductor substrate to define active regions;
    forming a plurality of gate lines crossing the active regions;
    forming a first interlayer dielectric layer on a surface of the semiconductor substrate for insulating the plurality of gate lines from each other;
    forming first contact plugs and second contact plugs connected to the active region by penetrating the first interlayer dielectric layer;
    forming landing pads to overlap portions of the first contact plugs on the first interlayer dielectric layer;
    forming recessed contact plugs having recessed portions by etching the second contact plugs to below a surface of the first interlayer dielectric layer, wherein forming landing pads and recessed contact plugs comprises:
    forming a conductive layer on the first contact plugs, the second contact plugs, and the first interlayer dielectric layer;
    forming a landing pad mask layer on the conductive layer; and
    forming the landing pads and the recessed contact plugs simultaneously, to overlap portions of the first contact plugs, by etching the conductive layer using the landing pad mask layer as an etching mask.

16. A method of fabricating a semiconductor device, the method comprising:
    forming a device isolation layer on a semiconductor substrate to define active regions therein;
    forming a plurality of gate lines crossing the active regions;
    forming a first interlayer dielectric layer on a surface of the semiconductor substrate for insulating the gate lines from each other;
    forming first contact plugs and second contact plugs connected to the active region by penetrating the first interlayer dielectric layer; and
    forming landing pads to overlap portions of the first contact plugs on the first interlayer dielectric layer; and
    forming recessed contact plugs having recessed portions by etching the second contact plugs, to below a surface of the first interlayer dielectric layer, wherein a lower surface of the landing pads is above and faces an upper surface of the recessed contact plugs and are separated from one another both laterally and vertically.

* * * * *